(12) United States Patent
Lu et al.

(10) Patent No.: US 7,899,652 B2
(45) Date of Patent: Mar. 1, 2011

(54) LINEAR PROGRAMMING SUPPORT VECTOR REGRESSION WITH WAVELET KERNEL

(75) Inventors: Zhao Lu, Auburn, AL (US); Jing Sun, Superior Township, MI (US); Kenneth R. Butts, Grosse Pointe Woods, MI (US)

(73) Assignees: Toyota Motor Engineering & Manufacturing North America, Inc., Erlanger, KY (US); The Regents of the University of Michigan, Ann Arbor, MI (US)

( * ) Notice: Subject to any disclaimer, the term of this patent is extended or adjusted under 35 U.S.C. 154(b) by 695 days.

(21) Appl. No.: 11/848,324

(22) Filed: Aug. 31, 2007

(65) Prior Publication Data
US 2009/0063115 A1 Mar. 5, 2009

(51) Int. Cl.
*G06F 7/60* (2006.01)
*G06G 7/48* (2006.01)
(52) U.S. Cl. .................................. 703/2; 703/8
(58) Field of Classification Search .................... 703/2, 8
See application file for complete search history.

(56) References Cited

U.S. PATENT DOCUMENTS

| | | | |
|---|---|---|---|
| 6,134,344 A | 10/2000 | Burges | |
| 6,961,719 B1 | 11/2005 | Rai | |
| 7,054,735 B2 | 5/2006 | Masuda et al. | |
| 7,220,214 B2 * | 5/2007 | Iwamoto et al. | 701/56 |
| 2002/0091471 A1 * | 7/2002 | Suzuki | 701/29 |
| 2005/0149234 A1 | 7/2005 | Vian et al. | |
| 2005/0261837 A1 | 11/2005 | Wegerich et al. | |

OTHER PUBLICATIONS

Vong et al., Prediction of automotive engine power and torque using least squares support vector machines and Bayesian inference., Oct. 2005., Engineering Applications of Artificial Intelligence 19 (2006). p. 277-287.*
Mangasarian et al., "Large Scale Kernel Regression Via Linear Programming"; Data Mining Institute Technical Report 99-02, Aug. 1999, Machine Learning 46(1/3), 255-269, Jan. 2002.
Vong et al., "Modeling of Modern Automotive Petrol Engine Performance Using Support Vector Machines", J Zhejiang Univ SCI 2005 6A(1):1-8.

* cited by examiner

*Primary Examiner* — Paul L Rodriguez
*Assistant Examiner* — Eunhee Kim
(74) *Attorney, Agent, or Firm* — Gifford, Krass, Sprinkle, Anderson & Citkowski, P.C.

(57) ABSTRACT

A support vector machine with wavelet kernel was developed for accurate modeling of nonlinear systems. A method of providing an optimized model of a nonlinear system includes using a support vector machine (SVM) having a wavelet kernel, where support vectors include a family of multidimensional wavelets. Training the SVM allows optimization of the number of support vectors, the weights of the support vectors, and the translation factors of the support vectors. Use of a novel linear programming approach reduces computational demands required for training, allowing optimized support vectors to give an optimized model of the nonlinear system. Further, on-line retraining is possible, so that the model can be adapted to changing conditions.

9 Claims, 5 Drawing Sheets

LINEAR PROGRAMMING SUPPORT VECTOR REGRESSION WITH WAVELET KERNEL

FIELD OF THE INVENTION

The present invention relates to nonlinear dynamical systems identification and modeling, in particular using linear programming support vector regression (LP-SVR) with wavelet kernel.

BACKGROUND OF THE INVENTION

Models of dynamical systems are of great importance in almost all fields of science and engineering and specifically in control, signal processing and information science. Most systems encountered in the real world are nonlinear and in many practical applications nonlinear models are required to achieve an adequate modeling accuracy. A model is always only an approximation of a real phenomenon so that having an approximation theory which allows for the analysis of model quality is a substantial concern.

Wavelet theory has been extensively studied in recent years, and has found many applications in various areas throughout science and engineering, such as numerical analysis and signal processing. Wavelets can capture the local behavior of signals both in frequency and time.

SUMMARY OF THE INVENTION

A support vector machine with wavelet kernel was developed for accurate modeling of nonlinear systems. A method of providing an optimized model of a nonlinear system includes using a support vector machine (SVM) having a wavelet kernel, where support vectors include a family of multidimensional wavelets. Training the SVM allows optimization of the number of support vectors, the weights of the support vectors, and the translation factors of the support vectors. Use of a novel linear programming approach reduces computational demands required for training, allowing optimized support vectors to give an optimized model of the nonlinear system. Further, in many applications on-line retraining is possible, so that the model can be adapted to changing conditions, new system parameters, and the like.

Applications include an electronic control unit (ECU) of a vehicle engine, the SVM providing a model of engine performance. The model can be changed as the engine ages, or other systems variations detected. Comparison of the model predictions with actual performance, which can be performed on-line using a sliding window of data, allow system (engine) changes to be detected. The ECU may be reprogrammed through retraining of the SVM using collected engine data. Diagnostic outputs may be obtained from a comparison of the model and actual engine performance.

Optimized support vectors for an engine type may be determined during an engine test process, and used as the initial configuration of the SVM in the ECU for engines of the same type in new vehicles. However, for each vehicle engine, the SVM may be optimized further by retraining on actual data from the individual engine. Hence, the performance of individual vehicle engines can be separately optimized.

By collecting system data from a nonlinear system, a predicted system performance using the support vector machine can be compared with actual performance so as to determine modeling error. If the error is greater than a predetermined threshold, the support vector machine may be retrained, for example using a computationally simpler linear programming method, to re-optimize feature vector parameters using the collected system data. Hence, an optimized model of the nonlinear system is maintained even if the system changes over time, as the system model can be re-optimized. Feature vector parameters may be optimized using a simple algorithm, such as a least squares algorithm, if the modeling error is less than a threshold value.

An improved electronic control unit for a vehicle engine comprises engine data inputs configured to receive engine data, the engine data including engine operation data and operator input data; engine control outputs, operable to control engine parameters (such as fuel injection quantity and valve timing), and an electronic control circuit. The electronic control circuit comprises at least a memory and a processor, the electronic circuit operable to use a support vector machine with a wavelet kernel as a model of the vehicle engine, the model being used to determine required control outputs from the engine data. The electronic control circuit may further be operable to determine a modeling error by comparing a modeled engine performance with an actual system performance, and to re-train the support vector machine if the modeling error is greater than a threshold value. Retraining the support vector machine may use a linear programming method to determine feature vector parameters from collected engine data, such as coolant temperature data, throttle position data, and the like.

DETAILED DESCRIPTION OF THE INVENTION

A support vector machine allows modeling of complex dynamic systems. The kernel of the support vector machine may be of various types. In examples of the present invention, the support vector machine has a wavelet kernel, which is well suited to modeling nonlinear systems, particularly to modeling dynamic nonlinear systems with transient behaviors.

Wavelet kernels improve accuracy over conventional SVM kernels, as a wavelet kernel is especially suitable for local signal analysis, signal-noise separation and detection of transients and jumping signals. The wavelet kernel also improves model sparsity, readily providing approximate orthogonality.

Examples of the present invention use a wavelet kernel in linear programming support vector regression for nonlinear dynamical systems identification. A novel approach was used to construct the wavelet networks by linear programming, allowing excellent generalization capability inherent in support vector learning and compact model expression. A linear programming support vector regression (SVR) was formulated, increasing computational efficiency and model sparsity over conventional approaches.

Applications include all types of nonlinear system modeling, and the general approach described has widespread applications including electronic engine control in automobiles, image compression, speech signal processing, process control generally, and other complex systems.

Support vector kernel expansion allows computational efficient representation of nonlinear dynamical systems and facilitates analysis. Using the support vector regression with the conventional quadratic programming technique, implementation is computationally expensive and sufficient model sparsity cannot be guaranteed.

In examples of the present invention, linear programming support vector regression (LP-SVR) with wavelet kernel is used for system modeling. Relationships between LP-SVR with wavelet kernel and wavelet networks are analyzed, in relation to nonlinear dynamical systems identification. Wavelet networks were constructed by linear programming, with excellent generalization capability inherent in support vector learning and compact model expression.

Wavelet networks can be used in various classification and identification problems Wavelet networks facilitate detecting essential features in "frequency-rich" signals, including transient data. In wavelet networks, both the position (translation parameter) and the dilation of the wavelets may be optimized, in addition to the weights accorded each wavelet in the network. A family of wavelets can be constructed by translations and dilations performed on a single fixed function called the mother wavelet. Each wavelet has a translation factor m and dilation factor d in relation to the mother wavelet. Families of wavelet functions are known to be universal approximators, allowing them to be used in function approximation and process modeling. Any function of the type $L^2(R)$ can be approximated to any prescribed accuracy with a finite sum of wavelets, each wavelet having a translation factor, dilation factor, and a weight. Nonlinear regression by wavelet networks can be used for both static modeling and for dynamic input-output modeling.

A data set can be modeled by a finite sum of wavelets, in particular a weighted sum of wavelets functions whose translation and dilation parameters ($m_j$ and $d_j$ respectively, see Equation 1) are adjustable real numbers, and these parameters are trained together with the weights. In this way, a wavelet family of parameterized nonlinear functions can be used for nonlinear regression, and their parameters are estimated by a training step.

Further Discussion of Wavelet Networks

Wavelet families are constructed by simple operations of translation and dilation of a single fixed function called the mother wavelet (sometimes called the analyzing wavelet). A wavelet $\phi_j(x)$ is derived from its mother wavelet $\phi(z)$ by the relation $$\phi_j(x) = \phi\left(\frac{x - m_j}{d_j}\right) = \phi(z_j) \qquad (1)$$

where the translation factor $m_j$ and the dilation factor $d_j$ are real numbers in $\Re$ and $\Re_+^*$, respectively. The family of functions generated by $\phi$ can be defined as $$\Omega_c = \left\{ \frac{1}{\sqrt{d_j}} \phi\left(\frac{x - m_j}{d_j}\right), m_j \in \Re \text{ and } d_j \in \Re_+^* \right\} \qquad (2)$$

A family $\Omega_c$ is said to be a frame of $L^2(R)$ if there exists two constants A and B, $0 < A \leq B < \infty$, such that for any square integrable function $f$, the following inequalities hold:

$$A\|f\|^2 \leq \sum_{\substack{j \\ \phi_j \in \Omega_c}} |\langle \phi_j, f \rangle|^2 \leq B\|f\|^2 \qquad (3)$$

where $\|f\|$ denotes the norm of function $f$ and $\langle f, g \rangle$ the inner product of functions $f$ and $g$. Families of wavelet frames of $L^2(R)$ are universal approximators.

For the modeling of multivariable processes, a multi-dimensional wavelet is defined. In examples described further below, a dictionary composed of tensor product wavelet functions was used, and the elements of the wavelet dictionaries were of the form $$\Phi_j\left(\begin{bmatrix} x_1 \\ \vdots \\ x_n \end{bmatrix}\right) = \prod_{k=1}^{n} \phi\left(\frac{x_k - m_{jk}}{d_{jk}}\right) \qquad (4)$$

where $m_j = [m_{j1}, m_{j1}, \ldots, m_{jn}]^T$ and $d_j = [d_{j1}, d_{j1}, \ldots, d_{jn}]^T$ are the translation and dilation vectors, respectively.

Multi-dimensional wavelet networks can be written as follows:

$$f_P(x) = \sum_{j=1}^{p} w_j \Phi_j(x), \qquad (5)$$

where $x = [x_1, x_2, \ldots, x_n]^T$ and $w_j$ are the weights of the network.

Linear Programming SVM with Wavelet Kernel

An example linear programming SVM with wavelet kernel was developed, using soft-constrained linear programming SVM. Both LP-SVR and QP-SVR algorithms may adopt the $\epsilon$-insensitive loss function, and use kernel functions in feature space.

Consider regression in the following set of functions $$f(x) = w^T \phi(x) + b \qquad (6)$$

with given training data, $\{(x_1, y_1), \ldots, (x_l, y_l)\}$ where l denotes the total number of exemplars, $x_i \in R^n$ are the input and $y_i \in R$ are the target output data. The nonlinear mapping $\phi: R^n \to R^m$ (m>n) maps the input data into a so-called high dimensional feature space (which can be infinite dimensional) and $w \in R^m$, $b \in R$. In $\epsilon$-SV regression, the goal is to find a function $f(x)$ that has at most $\epsilon$ deviation from the actually obtained targets $y_i$ for all the training data, and at the same time, is as smooth as possible.

In a support vector method, the empirical risk is minimized subject to elements of the structure:

$$\text{minimize } \frac{1}{2}\|w\|^2 + C\sum_{i=1}^{\ell}(\xi_i + \xi_i^*) \quad (7)$$

$$\text{subject to } \begin{cases} y_i - \langle w, \varphi(x_i)\rangle - b \le \varepsilon + \xi_i \\ \langle W, \varphi(x_i)\rangle + b - y_i \le \varepsilon + \xi_i^* \\ \xi_i, \xi_i^* \ge 0 \end{cases}$$

where the $\xi_i$ and $\xi_i^*$ are the slack variables, corresponding to the size of the excess deviation for positive and negative deviation respectively. This is a classic quadratic optimization problem with inequality constraints, and the optimization criterion penalizes data points whose y-values differ from $f(x)$ by more than $\epsilon$. The constant $C>0$ determines the trade-off between the flatness of $f$ and the amount up to which deviations larger than $\epsilon$ are tolerated. By defining the loss function, $$L(y_i - f(x_i)) = \begin{cases} 0, & \text{if } |y_i - f(x_i)| \le \varepsilon \\ |y_i - f(x_i)| - \varepsilon, & \text{otherwise} \end{cases} \quad (8)$$

the optimization problem (7) is equivalent to the following regularization problem, $$\text{minimize } R_{reg}[f] = \sum_{i=1}^{\ell} L(y_i - f(x_i)) + \lambda\|w\|^2 \quad (9)$$

where $f(x)$ is in the form of (6) and $\lambda\|w\|^2$ is the regularization term. According to the well-known Representer Theorem, the solution to the regularization problem (9) can be written as the following SV kernel expansion provided $k(x_i, x_i) = 1$ $$f(x) = \sum_{i=1}^{\ell} \beta_i k(x_i, x) \quad (10)$$

where $k(x_i, x)$ is the kernel function. Three commonly-used kernel functions in literature are:

Gaussian radial basis function (GRBF) kernel:

$$k(x, x') = \exp\left(\frac{-\|x - x'\|^2}{\sigma^2}\right) \quad (11)$$

Polynomial kernel:

$$k(x, x') = (1 + \langle x, x'\rangle)^q \quad (12)$$

Sigmoid kernel:

$$k(x, x') = \tan h(\alpha\langle x, x'\rangle + \gamma) \quad (13)$$

where $\sigma$, $q$, $\alpha$, $\gamma$ are the adjustable parameters of the above kernel functions. The kernel function provides an elegant way of working in the feature space avoiding all the troubles and difficulties inherent in high dimensions, and this method is applicable whenever an algorithm can be cast in terms of dot products. Defining $$\beta = [\beta_1\ \beta_2\ \ldots\ \beta_l]^T, \quad (14)$$

LP-SVR replaces (9) by $$\text{minimize } R_{reg}[f] = \sum_{i=1}^{\ell} L(y_i - f(x_i)) + \lambda\|\beta\|_1 \quad (15)$$

where $f(x)$ is in the form of (10) and $\|\beta\|_1$ denotes the $l_1$ norm in coefficient space. This regularization problem is equivalent to the following constrained optimization problem $$\text{minimize } \frac{1}{2}\|\beta\|_1 + C\sum_{i=1}^{\ell}(\xi_i + \xi_i^*) \quad (16)$$

$$\text{subject to } \begin{cases} y_i - \sum_{j=1}^{\ell} \beta_j k(x_j, x_i) \le \varepsilon + \xi_i \\ \sum_{j=1}^{\ell} \beta_j k(x_j, x_i) - y_i \le \varepsilon + \xi_i^* \\ \xi_i, \xi_i^* \ge 0 \end{cases}$$

From the geometric perspective, it can be followed that $\xi_i \xi_i^* = 0$ in SV regression. Therefore, it is sufficient to just introduce slack $\xi_i$ in the constrained optimization problem (16). Thus, the following formulation of SV regression is obtained, with fewer slack variables $$\text{minimize } \frac{1}{2}\|\beta\|_1 + C\sum_{i=1}^{\ell}(\xi_i + \xi_i^*) \quad (17)$$

$$\text{subject to } \begin{cases} y_i - \sum_{j=1}^{\ell} \beta_j k(x_j, x_i) \le \varepsilon + \xi_i \\ \sum_{j=1}^{\ell} \beta_j k(x_j, x_i) - y_i \le \varepsilon + \xi_i \\ \xi_i \ge 0 \end{cases}$$

The optimization problem above may be converted into a linear programming problem. The terms $\beta_i$ and $|\beta_i|$ are decomposed as follows:

$$\beta_i = \alpha_i^+ - \alpha_i^-\ \ |\beta_i| = \alpha_i^+ + \alpha_i^- \quad (18)$$

where $\alpha_i^+, \alpha_i^- \ge 0$. The decompositions in (18) are unique, i.e. for a given $\beta_i$ there is only one pair $(\alpha_i^+, \alpha_i^-)$ which fulfils both equations. Furthermore, both variables cannot be larger than zero at the same time, i.e. $\alpha_i^+ \cdot \alpha_i^- = 0$. In this way, the $l_1$ norm of $\beta$ can be written as $$\|\beta\|_1 = (\underbrace{1, 1, \ldots, 1}_{\ell}, \underbrace{1, 1, \ldots, 1}_{\ell})\begin{pmatrix} \alpha^+ \\ \alpha^- \end{pmatrix} \quad (19)$$

where $\alpha^+ = (\alpha_1^{30}, \alpha_2^+, \ldots, \alpha_l^+)^T$ and $\alpha^- = (\alpha_1^-, \alpha_2^-, \ldots, \alpha_l^-)^T$. Furthermore, the constraints in the formulation (17) can also be written in the following vector form $$\begin{pmatrix} K & -K & -I \\ -K & K & -I \end{pmatrix} \cdot \begin{pmatrix} \alpha^+ \\ \alpha^- \\ \xi \end{pmatrix} \leq \begin{pmatrix} y+\varepsilon \\ \varepsilon-y \end{pmatrix} \quad (20)$$

where $K_{ij}=k(x_i, x_j)$, $\xi=(\xi_1, \xi_2, \ldots, \xi_l)^T$ and I is l×l identity matrix. Thus, the constrained optimization problem (17) can be implemented by the following linear programming problem with the variables $$\text{minimize } c^T \begin{pmatrix} \alpha^+ \\ \alpha^- \\ \xi \end{pmatrix} \quad (21)$$

$$\text{subject to } \begin{pmatrix} K & -K & -I \\ -K & K & -I \end{pmatrix} \cdot \begin{pmatrix} \alpha^+ \\ \alpha^- \\ \xi \end{pmatrix} \leq \begin{pmatrix} y+\varepsilon \\ \varepsilon-y \end{pmatrix}$$

where $c = \left( \underbrace{1, 1, \ldots, 1}_{l}, \underbrace{1, 1, \ldots, 1}_{l}, \underbrace{2C, 2C, \ldots, 2C}_{l} \right)$ In the QP-SVR case, the set of points not inside the tube coincides with the set of SVs. While, in the LP context, this is no longer true—although the solution is still sparse, any point could be an SV, even if it is inside the tube. The sparse solution still can be obtained in LP-SVR even though the size of the insensitive tube was set to zero due to the usage of soft constraints; however, usually sparser solution can be obtained by using non-zero ε.

Linear Programming SVM with Wavelet Kernel

In a nonlinear support vector algorithm, the kernel provides a general framework to represent data. In this example, a wavelet kernel was used in linear programming support vector regression, and this also allows determination of the topological structure and translation parameters of wavelet networks by an efficient optimization approach. From equation (4), the wavelet kernel can be defined as:

$$k(x, x') = \prod_{k=1}^{n} \phi\left(\frac{x_k - x'_k}{d}\right), \quad (22)$$

and the corresponding SV wavelet kernel expansion can be written as:

$$f(x) = \sum_{i=1}^{l} \beta_i \prod_{k=1}^{n} \phi\left(\frac{x_k - x'_k}{d}\right) \quad (23)$$

$$= \sum_{i=1}^{l} (\alpha_i^+ - \alpha_i^-) \prod_{k=1}^{n} \phi\left(\frac{x_k - x'_k}{d_i}\right).$$

The model sparsity in equation (23) is measured by the ratio of non-zero components in the vector $\beta=[\beta_1 \beta_2 \ldots \beta_l]^T$, i.e., the ratio of support vectors. In the realm of nonlinear systems identification, training data are usually finite and non-uniformly sampled, so the problem is consequently ill-posed.

Conversion to a well-posed problem is typically achieved with some form of capacity control, which aims to balance the fitting of the data with constraints on the model flexibility, producing a robust model that generalizes successfully. In practice, such an optimization is accomplished by searching for the minimum number of the basis functions under the Occam's razor arguing that the model should be no more complex than is required to capture the underlying systems dynamics. Hence, in an attempt to achieve the highest generalization capability and the lowest system complexity, the $l_1$ norm of the weights in the model (23) was employed for model capacity control.

An optimal compact representation, including the number of support vectors, the weights and the translation factors, can be determined by solving the following linear programming problem:

$$\text{minimize } c^T \begin{pmatrix} \alpha^+ \\ \alpha^- \\ \xi \end{pmatrix} \quad (24)$$

$$\text{subject to } \begin{pmatrix} K & -K & -I \\ -K & K & -I \end{pmatrix} \cdot \begin{pmatrix} \alpha^+ \\ \alpha^- \\ \xi \end{pmatrix} \leq \begin{pmatrix} y+\varepsilon \\ \varepsilon-y \end{pmatrix}$$

where the K denotes the wavelet kernels matrix. Explicitly, the obtained SV wavelet kernel expansion (23) is essentially consistent with the expression of wavelet networks (5), and therefore the construction of the optimal wavelet network is fulfilled by solving the linear programming problem.

EXAMPLES

The problem of nonlinear black-box systems identification of a hydraulic robot arm is a benchmark problem in the realm of nonlinear systems identification, and it has been used widely for testing various identification methods.

In this nonlinear black-box dynamical system, the input u(t) represents the size of the valve through which oil flows into the actuator, and the output y(t) is a measure of oil pressure which determines the robot arm position. For the purpose of comparison, the same regressor is used, $x(t)=[y(t-1)\ y(t-2)\ y(t-3)\ u(t-1)\ u(t-2)]^T$, as that used previously in the literature. See A. Gretton et al., "Support vector regression for black-box system identification", Proceedings of the 11th IEEE Workshop on Statistical Signal Processing (2001), and J. Sjöberg et al., "Nonlinear black-box modeling in system identification: a unified overview", *Automatica,* 31, 1691-1724 (1995). Half of the data set containing 511 training data pairs were used for SVM training, and half as validation data. The generalization capability and accuracy of regression algorithms could be evaluated by making use of the root mean square (RMS) error $$E_{RMS} = \sqrt{\frac{1}{N}\sum_{i=0}^{N}[\hat{f}(x_i) - f(x_i)]^2} \quad (25)$$

where $\hat{f}(x_i)$ is the estimated value at point $x_i$ from the SVR model.

Example 1

Identification of Hydraulic Robot Arm Dynamics by SVR with RBF Kernel

In this example, the soft-constrained LP-SVR and QP-SVR with RBF kernel are applied to model the dynamic behavior of a hydraulic robot arm respectively. The same learning parameters for LP-SVR and QP-SVR are used: kernel width parameter—1; C (bound)—100; ϵ(tolerance)—0.03.

Figure 1:
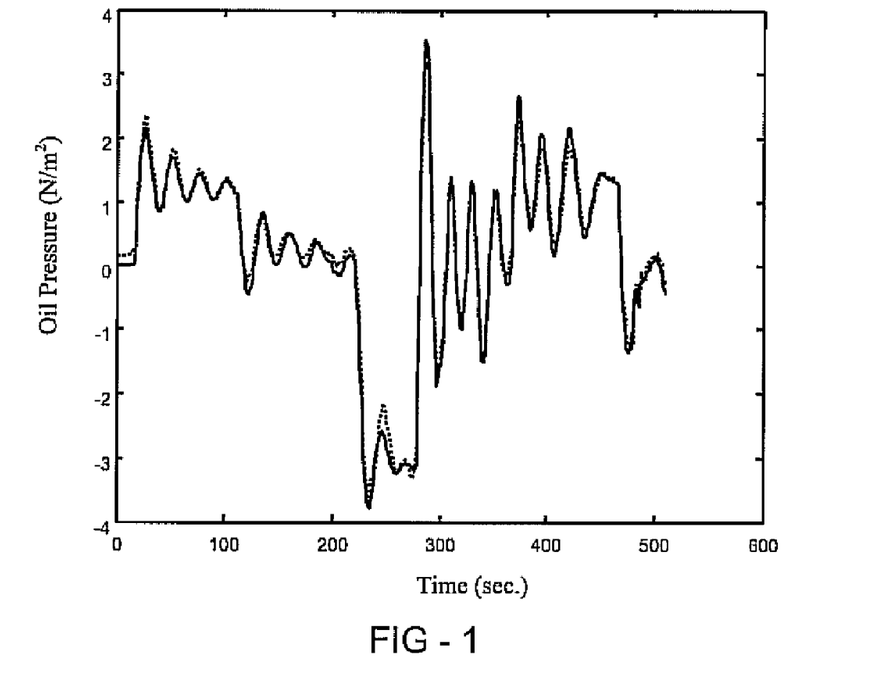
FIG. 1 shows identification by LP-SVR with RBF kernel on a training set, where the solid line is observation, and the dotted line a model from LP-SVR.
Figure 2:
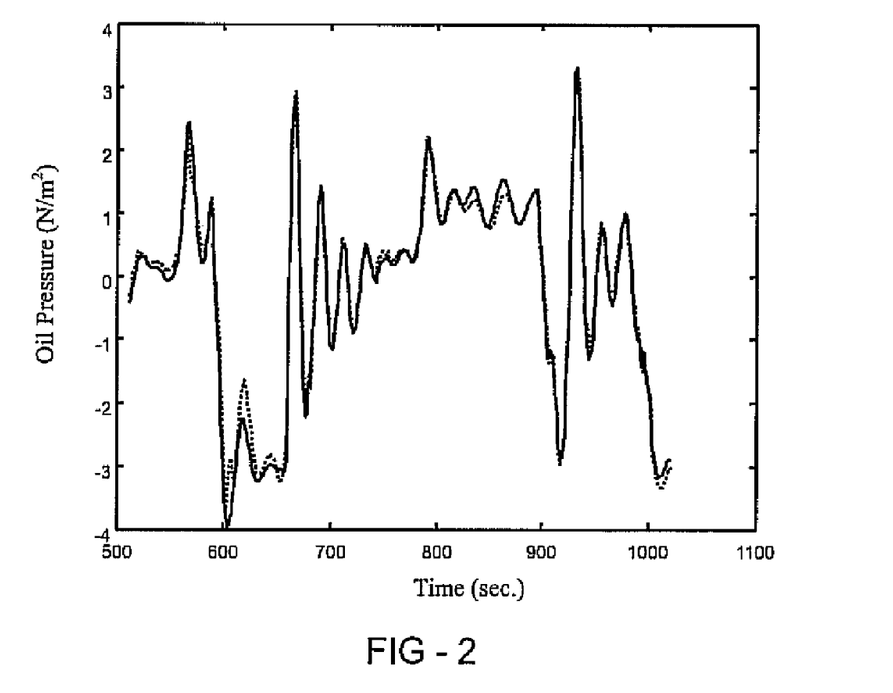
FIG. 2 shows identification by LP-SVR with RBF kernel on a validation set, where the solid line is observation, and the dotted line a model from LP-SVR.

FIGS. 1 and 2 show the identification results by LP-SVR, where the RMS error on validation data is 0.1959 and the ratio of SVs to the training vectors is 6.5%.

Figure 3:
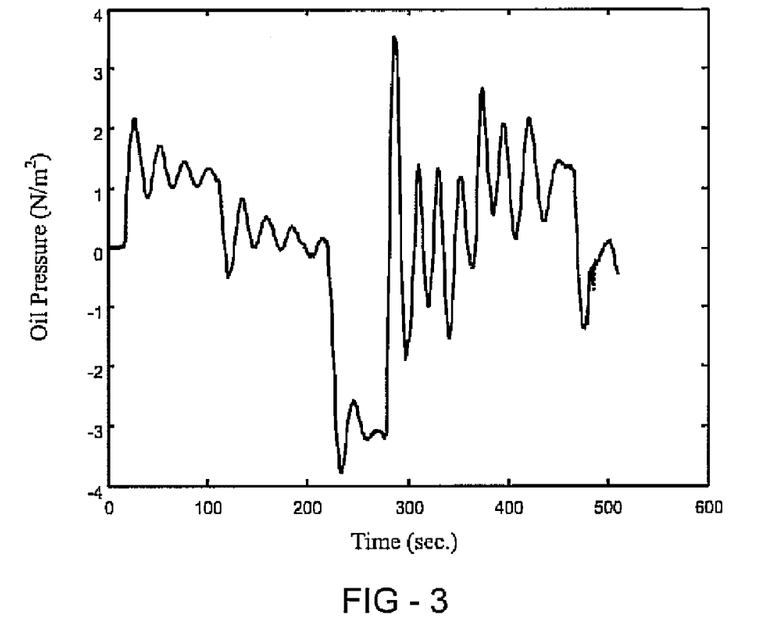
FIG. 3 shows identification by QP-SVR with RBF kernel on the training set, where the solid line is observation, and the dotted line a model from QP-SVR.
Figure 4:
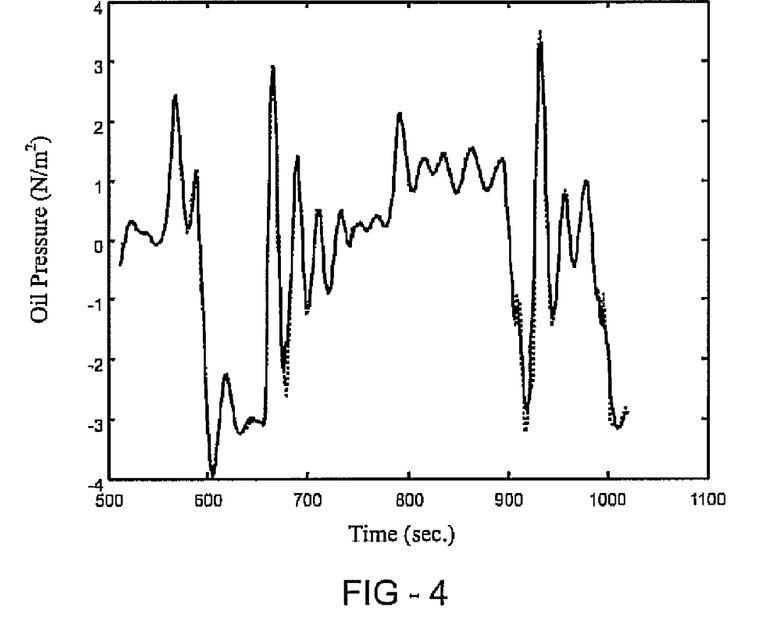
FIG. 4 shows identification by QP-SVR with RBF kernel on the validation set, where the solid line is observation, and the dotted line a model from QP-SVR.

FIGS. 3 and 4 visualize the identification results by QP-SVR, where the RMS error on validation set is 0.1597 and the ratio of SVs to the training vectors is 39.7%. In this example, the prediction accuracy from LP-SVR is comparable with that from QP-SVR, and the LP-SVR is around 25 times faster than QP-SVR for training, which means that the computing resources required by QP-SVR may become prohibitively expensive when the size of the training set is increased.

Example 2

Identification of Hydraulic Robot Arm Dynamics by SVR with Wavelet Kernel

For the sake of validating the performance of wavelet kernel in nonlinear identification, the soft-constrained LP-SVR and QP-SVR with wavelet kernel are used to model the dynamic behavior of a hydraulic robot arm respectively. Without loss of generality, a translation-invariant wavelet kernel is constructed by the following wavelet function $$\phi(x) = \cos(1.75x)\exp\left(-\frac{x^2}{2}\right) \quad (26)$$

Analogous to Example 1, the same learning parameters for LP-SVR and QP-SVR are used: C (bound)—100; ϵ (tolerance)—0.03. Since SVMs cannot optimize the parameters of kernels, it is difficult to determine l parameters $d_i$, i=1,2,...,l in equation (23). For simplicity, let $d_i$=d such that the number of parameters becomes 1. In our experiment, the parameter d is set to 3 by the widely-used technique of cross validation.

Figure 5:
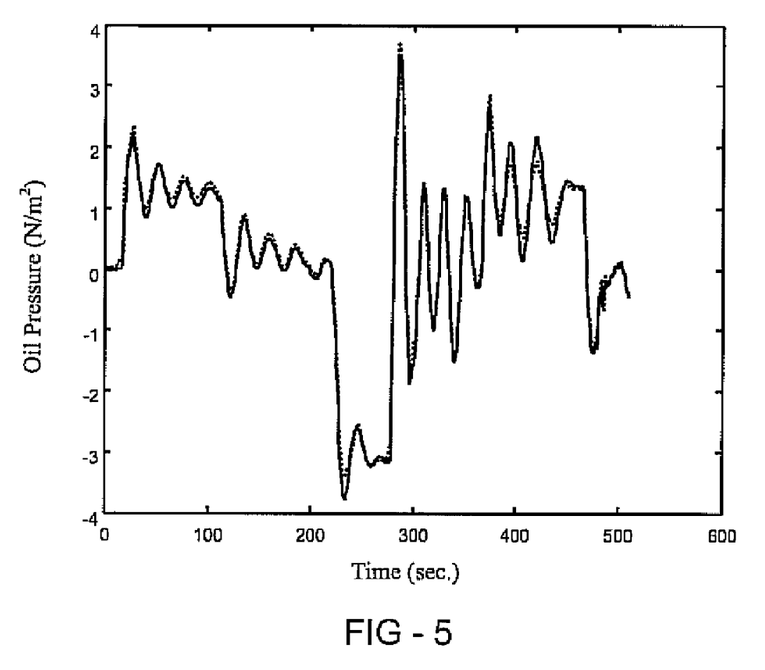
FIG. 5 shows identification by LP-SVR with wavelet kernel on the training set, where the solid line is observation, and the dotted line a model from LP-SVR.
Figure 6:
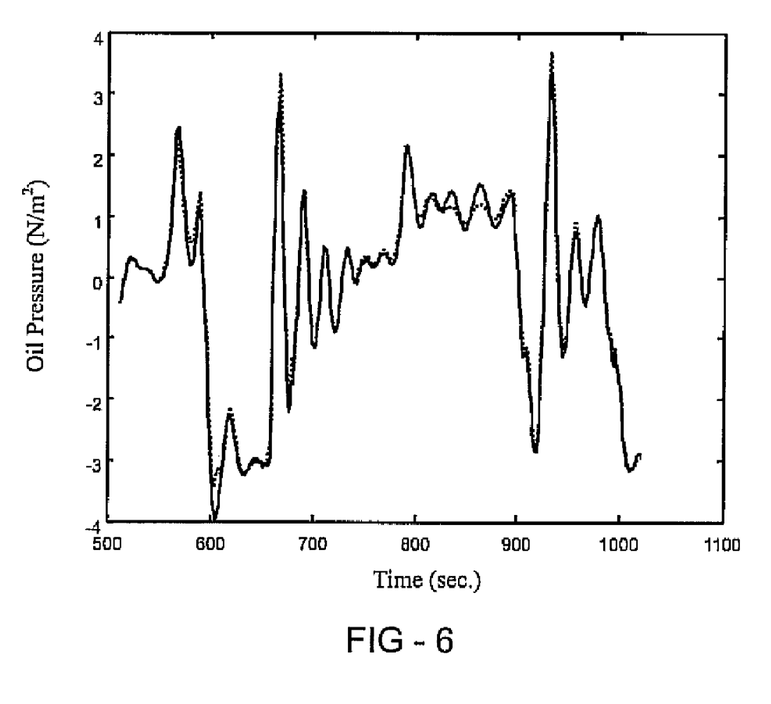
FIG. 6 shows identification by LP-SVR with wavelet kernel on the validation set, where the solid line is observation, and the dotted line a model from LP-SVR.
Figure 7:
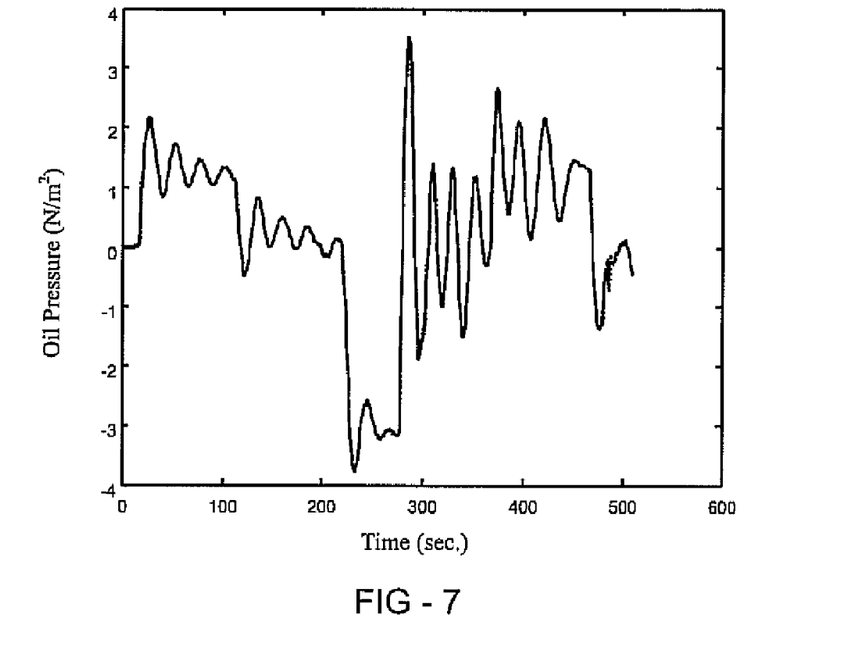
FIG. 7 shows identification by QP-SVR with wavelet kernel on the training set, where the solid line is observation, and the dotted line a model from QP-SVR.
Figure 8:
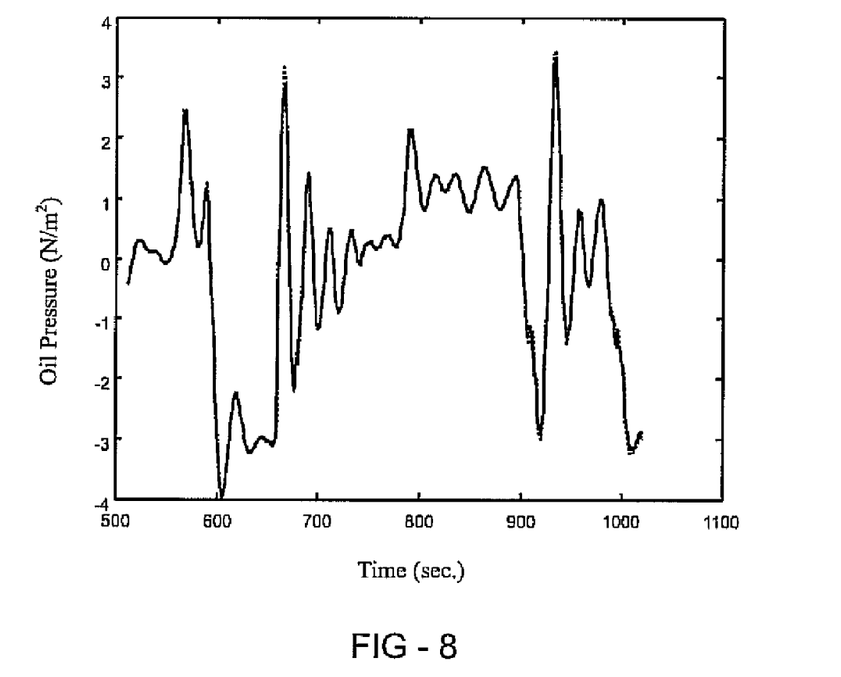
FIG. 8 shows identification by QP-SVR with wavelet kernel on the validation set, where the solid line is observation, and the dotted line a model from QP-SVR.

The identification results by LP-SVR are illustrated in FIGS. 5-6, where the RMS error on the validation data is 0.1667 and the ratio of SVs to the training vectors is 3.1%. FIGS. 7-8 visualize the identification results by QP-SVR, where the RMS error on the validation set is 0.1016 and the ratio of SVs to the training vectors is 33.7%.

The experimental results obtained in Example 1 and 2 are summarized in Table 1.

TABLE 1

Comparison On Model Sparsity And RMS Error Of Different SVRs

| SVR algorithm | SV ratio | RMS error on validation set |
|---|---|---|
| LP-SVR with RBF kernel | 6.5% | 0.1959 |
| LP-SVR with wavelet kernel | 3.1% | 0.1667 |
| QP-SVR with RBF kernel | 39.7% | 0.1597 |
| QP-SVR with wavelet kernel | 35.0% | 0.1076 |

The data in Table 1 shows that a much sparser model can be generated from LP-SVR than that from QP-SVR, with comparable prediction accuracy, and a much better sparsity can be obtained using the wavelet kernel. Particularly, the LP-SVR is around 25 times faster than QP-SVR for training, which means that the computing resources required by QP-SVR may become prohibitively-expensive with the increase of the size of training set.

The RMS error on validation sets acquired by using other identification algorithms are reported in Gretton et al. and J. Sjöberg et al (see above for full references), including 0.579 from wavelet networks, 0.467 from one-hidden-layer sigmoid neural networks with 10 hidden nodes, and 0.280 from v-support vector regression. Higher prediction accuracy was obtained by using the soft-constrained LP-SVR and QP-SVR.

An on-line iterative algorithm can be developed for linear programming support vector regression with wavelet kernel, and an efficient linear programming algorithm developed.

Fuzzy Support Vector Regression

Fuzzy support vector regression with wavelet kernel can be used for identifying a time-varying nonlinear systems. In fuzzy LP-SVR, the fuzzy membership $0 \leq s_i \leq 1$ is introduced to measure the importance of the corresponding point. The approach can be summarized as:

$$\text{minimize } \frac{1}{2}\|\beta\|_1 + 2C\sum_{i=1}^{l} s_i \xi_i \quad (27)$$

$$\text{subject to } \begin{cases} y_i - \sum_{j=1}^{l} \beta_j k(x_j, x_i) \leq \varepsilon + \xi_i \\ \sum_{j=1}^{l} \beta_j k(x_j, x_i) - y_i \leq \varepsilon + \xi_i \\ \xi_i \geq 0 \end{cases}$$

where $\beta = [\beta_1, \beta_2, \beta_3, \ldots \beta_l]^T$, and C is a constant.

For a sequential learning problem, a σ>0 was chosen as the lower bound of fuzzy membership. Second, as time is the main property of this kind of problem, fuzzy membership $s_i$ was made a function of time $t_i$, i.e. $s_i$=h($t_i$), where $t_i \leq \ldots \leq t_1$ is the time the data arrived in the system. The last point $x_1$ is made the most important point, i.e. $s_1$=h($t_1$)=1, the first point $x_1$ is made the least important, where $s_1$=h($t_1$)=σ.

If fuzzy membership is made a linear function of time, we can select:

$$s_i = h(t_i) = at_i + b \quad (28)$$

By applying the boundary conditions, we obtain:

$$s_i = h(t_i) = \frac{1-\sigma}{t_l - t_1} t_i + \frac{t_l \sigma - t_1}{t_l - t_1} \quad (29)$$

Alternatively, fuzzy membership is made a quadric function of the time, then we can select:

$$s_i = h(t_i) = a(t_i - b)^2 + c \quad (30)$$

By applying the boundary conditions, we obtain:

$$s_i = h(t_i) = (1-\sigma)\left(\frac{t_i - t_1}{t_l - t_1}\right) + \sigma \quad (31)$$

A sliding window strategy can be used to develop an on-line learning algorithm for identifying a time-varying nonlinear system. A variable sliding window for SV learning may be implemented by defining a threshold for the violations (violations then corresponding to the model predictions differing from actual data by more than the threshold value), and counting the number of violations of within the sliding window(s).

A variable-length sliding window on-line identification scheme can be adapted to cope with abrupt changes in the system to be identified. If the number of violations is below the defined threshold defined, fast updating of the linear weights of wavelet networks is performed, for example using a least squares algorithm. However, if the number of violations exceeds the defined threshold, SV learning is implemented to refresh the structure of wavelet networks using a linear programming support vector regression algorithm. This approach allows on-line training, and allows the model used to track both sudden and long-term changes in the modeled system.

In an example approach, sliding window blockwise SV learning is combined with a linear least square (LS) algorithm (or other fast algorithm). According to the available computational capacity and the characteristic of the identified system, a fixed sliding window size for SV learning can be defined. SV learning with the data within the sliding window is triggered by a change detection scheme. The linear LS algorithm could be used for adjusting the linear weights when the SV learning is not triggered, i.e. the model deviations from the actual system are below a triggering threshold for learning.

Change detection may be based on the output prediction error:

$$e_i = y_i - \sum_{j=1}^{l} \beta_j k(x_j, x_i) \qquad (32)$$

Occurrence of a system change can be declared if the following accumulated detection index:

$$d_e(k) = \frac{1}{M_e} \sum_{j=k-M_e+1}^{k} e_l^T e_l \qquad (33)$$

exceeds a pre-set threshold $\rho e$: i.e. $d_e \geq \rho_e$.

Hence, a fuzzy linear programming support vector regression (LP-SVR) with wavelet kernel is well suited to handle a time-varying nonlinear systems, and provides a fast and reliable system change the system detection and modeling scheme.

Using a multi-dimensional wavelet kernel may require computation of the tensor product:

$$\Phi_j(x) = \prod_{k=1}^{n} \varphi\left(\frac{x_k - m_{jk}}{d_{jk}}\right) \qquad (34)$$

In other examples, a multi-dimensional wavelet kernel without tensor product can be used to improve computational efficiency.

Applications

Applications of examples of the present invention include modeling of dynamic systems, such as process control, including chemical, physical, and/or mechanical process control. Applications further include image analysis (such as image cataloging, object recognition such as face detection, and the like), voice recognition, and computationally demanding applications. A particular application is engine management and control applications, described further below.

Engine Control

Vehicles, such as automobiles, often include an electronic control unit (ECU) for engine control. The ECU receives engine data from various engine sensors, and uses the engine data and an engine model to modify engine operational parameters. Engine sensors providing engine data may include a throttle position sensor, oxygen sensor, manifold absolute pressure (MAP) sensor, air temperature sensor, coolant temperature sensor, and the like. Engine parameters controlled by an ECU may include fuel injection quantities, ignition timing, variable valve timing (VVT), turbocharger boost (if applicable), and the like. In a typical example, the throttle position sensor provides a throttle position signal as part of the engine data received by the ECU, which in response increases the fuel injection quantities.

Engine operation is enhanced by using an ECU that uses an accurate model of engine operation. However, the number of model parameters may become large, so that the computing power necessary to set up (train) and run the model becomes substantial, particularly using conventional approaches. Engine operation is a dynamic process and response to transient data may need to be substantially immediate, such as less than a second. Operator inputs (such as throttle position) are received by the ECU, and result in control of engine operation parameters (such as fuel injection quantity). There may also be adverse safety consequences if an engine model used does not readily allow the ECU to detect or respond quickly to transient data. Hence, dynamic modeling methods using an SVM with wavelet kernel described herein are particularly useful for engine control applications.

Figure 9:
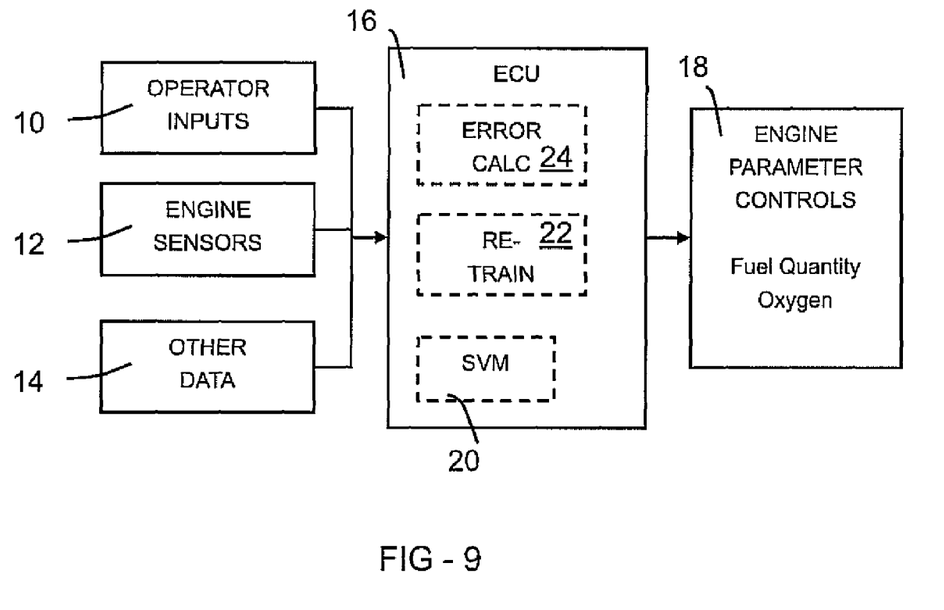
FIG. 9 is a simplified schematic of an engine control system.

FIG. 9 is a simplified schematic of an engine control system, comprising sources of engine data such as operator input sensors 10 (such as a throttle position sensor), engine operation sensors 12 (such as a coolant temperature sensor, fuel flow sensor, rpm sensor, and the like), and optional other data sources 14, such as signals from an automatic cruise control system. Engine data is provided to the ECU 16, and the ECU uses an engine model to provide control outputs to engine parameter controls 18 (such as fuel flow or quantity controls). The engine model is a SVM (20) within the ECU (or otherwise in communication with the ECU), having a wavelet kernel as described more fully above. An error calculation module (24) monitors the accuracy of the model, for example by comparing predicted engine behavior and actual response to engine parameter controls.

Data from a sliding time window may be stored in a memory within the ECU and used for comparison and retraining of the SVM. A linear programming module (22) is used to reprogram the SVM if errors are above a threshold value, for example optimizing vector parameters using stored data. Possible ECU functional modules are represented by dashed boxes in the figure, and may correspond to algorithms executable by a processor within the ECU. The ECU may further include a clock and allow rolling time gated storage of data in memory. Support vector parameters may be stored in non-volatile memory.

For a new vehicle engine, SVM model parameters may be determined from a previous engine testing and model training process using another of the same type of engine. However, these training parameter values may become more inaccurate as the engine wears. Hence, the dynamic model can be adjusted based on a comparison of model predictions and actual observed engine performance. This allows individual optimization of engine performance. The optimized model parameters may further be diagnostic of engine condition.

A support vector machine can be used to model any dynamic process, and is particularly well suited to engine management applications. In examples of the present invention, dynamic system modeling using a support vector machine with a wavelet kernel uses a computationally simpler linear programming approach.

Hence, embodiments of the present invention allow improved engine behavior modeling as a function of adjustable engine parameters. An electronic control unit for an engine can use an SVM-based engine model to improve engine performance. In some examples, improved engine modeling allows engine performance to be optimized in relation to one or more goals, such as exhaust emission reduction, fuel economy enhancement, acceleration, or other engine performance metric.

Conventional approaches become computationally challenging as the number of engine control inputs increase. Further, conventional modeling approaches, such as the use of look-up tables, are not adaptive, often use steady state operation to generate the model, and hence often do not properly describe transient behavior (non-steady state behavior) of the engine. In contrast, engine modeling according to embodiments of the present invention provides accurate representation of transient engine performance data. Further, training of an engine model according to an embodiment of the present invention may be much simpler, as there is no need to achieve numerous steady state operating conditions of the engine. Data-rich transient operation may be used for training purposes. Further, on-line training is possible, during normal operation of the vehicle.

Embodiments of the present invention may be used for other types of modeling, in particular modeling of any type of complex multi-input, multi-output nonlinear systems. Sparsity of the generated model facilitates real-time computation and on-line model adaptability. Embodiments of the present invention include modeling of transient responses in complex systems.

The invention is not restricted to the illustrative examples described above. Examples are not intended as limitations on the scope of the invention. Methods, apparatus, and the like described herein are exemplary and not intended as limitations on the scope of the invention. Changes therein and other uses will occur to those skilled in the art. The scope of the invention is defined by the scope of the claims.

Having described our invention, we claim:

1. A method of providing an optimized model of a nonlinear system, the method comprising:
   providing a support vector machine, the support vector machine having a wavelet kernel, support vectors being provided by a family of multidimensional wavelets and providing a model of the nonlinear system;
   providing training data to the support vector machine; and
   using the training data to optimize the support vectors through an optimization of the number of support vectors, weights of a support vector expansion, and translation factors of the support vectors using a linear programming algorithm,
   the optimized support vectors providing the optimized model of the nonlinear system,
   linear programming support vector regression (LP-SVR) with the wavelet kernel being used for modeling the nonlinear system,
   the support vector expansion having the form $$f(x) = \sum_{i=1}^{l} \beta_i \prod_{k=1}^{n} \phi\left(\frac{x_k - x'_k}{d}\right) = \sum_{i=1}^{l} (\alpha_i^+ - \alpha_i^-) \prod_{k=1}^{n} \phi\left(\frac{x_k - x'_k}{d_i}\right)$$

and the linear programming algorithm having the form $$\text{minimize } c^T \begin{pmatrix} \alpha^+ \\ \alpha^- \\ \xi \end{pmatrix}$$

$$\text{subject to } \begin{pmatrix} K & -K & -I \\ -K & K & -I \end{pmatrix} \cdot \begin{pmatrix} \alpha^+ \\ \alpha^- \\ \xi \end{pmatrix} \leq \begin{pmatrix} y + \varepsilon \\ \varepsilon - y \end{pmatrix}$$

where $$c = \left(\underbrace{1, 1, \ldots, 1}_{l}, \underbrace{1, 1, \ldots, 1}_{l}, \underbrace{2C, 2C, \ldots, 2C}_{l}\right)^T,$$

and where $\phi$ is a wavelet function, $\beta_i$ is a support vector ratio factor decomposable as $\beta_i = \alpha_i^+ - \alpha_i^-$, $|\beta_i| = \alpha_i^+ + \alpha_i^-$, $x'_k$ is a translation factor, $d_i$ is a dilation factor, $\epsilon$ is a model deviation parameter, y is a data value, K is a wavelet kernel matrix, $\zeta$ is a slack variable, I is an identity matrix, C is a constant, $\alpha_i^+$, $\alpha_i^- \geq 0$, $\alpha^+ = (\alpha_1^+, \alpha_2^+, \ldots, \alpha_l^+)^T$ and $\alpha^- = (\alpha_1^-, \alpha_2^-, \ldots, \alpha_l^-)^T$.

2. The method of claim 1, wherein the method is used to control a vehicle engine, the support vector machine providing a model of engine performance.

3. The method of claim 2, wherein the training data and optimized support vectors are determined during an engine test process,
   the method further comprising using the optimized support vectors in an engine model used by an electronic control unit for a similar engine.

4. A method of maintaining an optimized model of a nonlinear system, the method comprising:
   collecting system data from the nonlinear system;
   providing the system data to a support vector machine, the support vector machine having a wavelet kernel, support vectors being provided by a family of multidimensional wavelets and providing a model of the nonlinear system;
   modeling the nonlinear system using linear programming support vector regression (LP-SVR) with the wavelet kernel;
   determining a predicted system performance using the support vector machine;
   determining a modeling error by comparing the predicted system performance with actual system performance over a time period; and
   retraining the support vector machine if the modeling error is greater than a threshold value, wherein retraining the support vector machine uses a linear programming method to determine model parameters from collected system data,
   wherein the model of the nonlinear system is maintained in an optimized condition even if the nonlinear system changes, the support vector expansion having the form $$f(x) = \sum_{i=1}^{l} \beta_i \prod_{k=1}^{n} \phi\left(\frac{x_k - x'_k}{d_i}\right) = \sum_{i=1}^{l} (\alpha_i^+ - \alpha_i^-) \prod_{k=1}^{n} \phi\left(\frac{x_k - x'_k}{d_i}\right)$$

and the linear programming algorithm having the form $$\text{minimize } c^T \begin{pmatrix} \alpha^+ \\ \alpha^- \\ \xi \end{pmatrix}$$

$$\text{subject to } \begin{pmatrix} K & -K & -I \\ -K & K & -I \end{pmatrix} \cdot \begin{pmatrix} \alpha^+ \\ \alpha^- \\ \xi \end{pmatrix} \leq \begin{pmatrix} y + \varepsilon \\ \varepsilon - y \end{pmatrix}$$

where $$c = \left(\underbrace{1, 1, \ldots, 1}_{l}, \underbrace{1, 1, \ldots, 1}_{l}, \underbrace{2C, 2C, \ldots, 2C}_{l}\right)^T,$$

and where $\phi$ is a wavelet function, $\beta_i$ is a support vector ratio factor decomposable as $\beta_i = \alpha_i^+ - \alpha_i^-$, $|\beta_i| = \alpha_i^+ + \alpha_i^-$, $x'_k$ is a translation factor, $d_i$ is a dilation factor, $\epsilon$ is a model deviation parameter, y is a data value, K is a wavelet kernel matrix, $\zeta$ is a slack variable, I is an identity matrix, C is a constant, $\alpha_i^+$, $\alpha_i^- \geq 0$, $\alpha^+ = (\alpha_1^+, \alpha_2^+, \ldots, \alpha_l^+)^T$ and $\alpha^- = (\alpha_1^-, \alpha_2^-, \ldots, \alpha_l^-)^T$.

5. The method of claim 4, further comprising:
adjusting feature vector parameters using a least squares algorithm if the modeling error is less than a threshold value.

6. The method of claim 4, wherein the nonlinear system is a vehicle engine, wherein retraining the support vector machine corresponds to reprogramming an electronic control unit for the vehicle engine.

7. An apparatus, the apparatus being an electronic control unit for a vehicle engine, the apparatus comprising:
engine data inputs configured to receive engine data, the engine data including engine operation data and operator input data;
engine control outputs, operable to control engine parameters, the engine parameters including fuel injection quantity; and
an electronic control circuit, the electronic control circuit comprising at least a memory and a processor, the electronic circuit operable to use a support vector machine with a wavelet kernel as a model of the vehicle engine, the model being used to determine required engine parameters from the engine data using linear programming support vector regression (LP-SVR) with the wavelet kernel,
the electronic control circuit further operable to determine a modeling error by comparing a modeled engine performance with an actual engine performance, and to re-train the support vector machine if the modeling error is greater than a threshold value,
wherein retraining the support vector machine uses a linear programming method to determine feature vector parameters from collected engine data,
the support vector expansion having the form $$f(x) = \sum_{i=1}^{l} \beta_i \prod_{k=1}^{n} \phi\left(\frac{x_k - x'_k}{d_i}\right) = \sum_{i=1}^{l} (\alpha_i^+ - \alpha_i^-) \prod_{k=1}^{n} \phi\left(\frac{x_k - x'_k}{d_i}\right)$$

and the linear programming algorithm having the form $$\text{minimize } c^T \begin{pmatrix} \alpha^+ \\ \alpha^- \\ \xi \end{pmatrix}$$

$$\text{subject to } \begin{pmatrix} K & -K & -I \\ -K & K & -I \end{pmatrix} \cdot \begin{pmatrix} \alpha^+ \\ \alpha^- \\ \xi \end{pmatrix} \leq \begin{pmatrix} y + \varepsilon \\ \varepsilon - y \end{pmatrix}$$

where $$c = \left(\underbrace{1, 1, \ldots, 1}_{l}, \underbrace{1, 1, \ldots, 1}_{l}, \underbrace{2C, 2C, \ldots, 2C}_{l}\right)^T,$$

and where $\phi$ is a wavelet function, $\beta_i$ is a support vector ratio factor decomposable as $\beta_i = \alpha_i^+ - \alpha_i^-$, $|\beta_i| = \alpha_i^+ + \alpha_i^-$, $x'_k$ is a translation factor, $d_i$ is a dilation factor, $\epsilon$ is a model deviation parameter, y is a data value, K is a wavelet kernel matrix, $\zeta$ is a slack variable, I is an identity matrix, C is a constant, $\alpha_i^+$, $\alpha_i^- \geq 0$, $\alpha^+ = (\alpha_1^+, \alpha_2^+, \ldots, \alpha_l^+)^T$ and $\alpha^- = (\alpha_1^-, \alpha_2^-, \ldots, \alpha_l^-)^T$.

8. The apparatus of claim 7, wherein the engine data comprises coolant temperature data and throttle position data.

9. The apparatus of claim 7, wherein the engine parameters comprise fuel injection quantity and valve timing.

* * * * *